(12) United States Patent
Tamai et al.

(10) Patent No.: US 9,508,431 B2
(45) Date of Patent: Nov. 29, 2016

(54) NONVOLATILE SEMICONDUCTOR MEMORY DEVICE OF VARIABLE RESISTIVE TYPE WITH REDUCED VARIATIONS OF FORMING CURRENT AFTER BREAKDOWN

(71) Applicant: ELPIDA MEMORY, INC., Tokyo (JP)

(72) Inventors: Yukio Tamai, Osaka (JP); Yusuke Jono, Tokyo (JP)

(73) Assignee: ELPIDA MEMORY, INC., Tokyo (JP)

( * ) Notice: Subject to any disclaimer, the term of this patent is extended or adjusted under 35 U.S.C. 154(b) by 424 days.

(21) Appl. No.: 13/909,505

(22) Filed: Jun. 4, 2013

(65) Prior Publication Data

US 2013/0329484 A1 Dec. 12, 2013

(30) Foreign Application Priority Data

Jun. 8, 2012 (JP) ................................. 2012-130349

(51) Int. Cl.
*G11C 11/00* (2006.01)
*G11C 13/00* (2006.01)

(52) U.S. Cl.
CPC ....... *G11C 13/0069* (2013.01); *G11C 2213/32* (2013.01); *G11C 2213/34* (2013.01); *G11C 2213/79* (2013.01)

(58) Field of Classification Search
CPC .......... G11C 13/0069; G11C 2213/32; G11C 2213/34; G11C 2213/79
USPC ................. 365/148, 203, 204, 158, 171, 173
See application file for complete search history.

(56) References Cited

U.S. PATENT DOCUMENTS

| 5,313,107 | A * | 5/1994 | Itoh ........................ G11C 5/145 |
| | | | 326/88 |
| 7,778,064 | B2 * | 8/2010 | Parkinson et al. ............ 365/148 |
| 2007/0008781 | A1 * | 1/2007 | Jono et al. ............... 365/185.23 |
| 2008/0170445 | A1 * | 7/2008 | Mori ........................ 365/189.07 |
| 2009/0116280 | A1 * | 5/2009 | Parkinson .......... G11C 13/0004 |
| | | | 365/163 |

OTHER PUBLICATIONS

I. G. Baek et al., "Highly Scalable Non-volatile Resistive Memory using Simple Binary Oxide Driven by Asymmetric Unipolar Voltage Pulses" Process Development Team, Semiconductor R&D Center, Samsung Electronics Co., Ltd., IEDM, 2004, pp. 23.6.1-23.6.4.

* cited by examiner

*Primary Examiner* — Tha-O H Bui
(74) *Attorney, Agent, or Firm* — Sughrue Mion, PLLC

(57) ABSTRACT

A device including a memory cell including a variable resistive memory element; a capacitor; a voltage generation circuit; and a switch circuit including a first switch and a second switch. The first switch is coupled between the voltage generation circuit and the capacitor without an intervention of the second switch. The second switch is coupled between the capacitor and the memory cell without an intervention of the first switch. The first switch is configured to take an on-state during a first period of time and an off-state during a second period of time following the first period of time and the second switch is configured to take an off-state during the first period of time and an on-state during the second period of time.

13 Claims, 12 Drawing Sheets

NONVOLATILE SEMICONDUCTOR MEMORY DEVICE OF VARIABLE RESISTIVE TYPE WITH REDUCED VARIATIONS OF FORMING CURRENT AFTER BREAKDOWN

BACKGROUND OF THE INVENTION

Field of the Invention

The present invention relates to a nonvolatile semiconductor memory device, and more particularly to a nonvolatile semiconductor memory device using a variable resistive element that can store information by changing in electric resistance caused by applying of electric stress.

Description of Related Art

In recent years, the capacity of a nonvolatile semiconductor memory device as represented by a flash memory becomes remarkably larger. At the product level, products with a capacity of over 10 gigabytes are available at low prices. The value of the products is rising especially as portable or mobile memories such as USB memories, and the device is increasingly likely to grab shares of the market dominated by magnetic optical discs and the like. The capacity of several gigabytes is enough to serve as the storage of portable music players. Compared with a hard disk-equipped portable music player that has been rapidly becoming popular, a portable music player that is equipped with a nonvolatile semiconductor memory device, which is a solid-state element memory, has succeeded in appealing to users in terms of vibration resistance, high reliability, and low power consumption, which are, in principle, superior properties unique to the solid-state element memory. The solid-state element memory is expected to become mainstream as the storage of portable or mobile products for music and pictures.

Meanwhile, as candidates for next-generation nonvolatile semiconductor memory devices, which could overcome drawbacks of flash memories and are characterized by high-speed operation, research and development have been underway in recent years on nonvolatile memory elements that are each based on unique principles, such as a ferroelectric memory (FeRAM), magnetic memory (MRAM), phase change memory (PRAM), and resistance variable memory (RRAM) (Registered Trademark). As a method of rewriting information of the nonvolatile memory elements, there are two methods: a method of rewriting by using a bipolar voltage or current; and a method of rewriting by using a single polar voltage or current. FeRAM and MRAM employ the former driving method, while PRAM employs the latter. There are reports that RRAM are driven by both methods.

For example, RRAM is made up of a variable resistive element having a structure in which a variable resistor made of metal oxide is held between two electrodes. There are the following types: a type in which resistance is changed all over an electrode surface; and a filament type that has a local current path (called "filament") between electrodes, and resistance is changed by opening and closing of the current path. A low-resistance state and a high-resistance state correspond to digital information "1" and "0," respectively. In this manner, information can be recorded.

Prior to a resistance switching operation, a variable resistive element of a filament type is required to perform an initialization operation involving soft breakdown, which is called forming, in order to form a filament. As one example of RRAM, the technology disclosed in Baek, I. G. et al. "Highly Scalable Non-volatile Resistive Memory using Simple Binary Oxide Driven by Asymmetric Unipolar Voltage Pulses" IEDM2004, pp. 587-590, 2004 is known.

In RRAM having the filament-type variable resistive element, it is possible to control a current that flows after breakdown. However, in principle, it is difficult to control the period from when a voltage is applied until when the breakdown starts. FIG. 10 shows changes of current over time which flows at a time when a forming voltage pulse is applied at two variable resistive elements where hafnium oxide (HfO$_x$), which functions as a variable resistor, is held between a Ta electrode and a TiN electrode. During an initial period of applying of a voltage pulse, the variable resistive elements are in a post-production initial high-resistance state. However, as the resistance rapidly drops due to the breakdown, the current starts to flow. As shown in FIG. 10, there is a difference between the elements in terms of the period from when a voltage pulse starts to be applied until when the breakdown starts. For example, in the case of FIG. 10, the period of the element 1 is short at about 70 ns, while the period of the element 2 is about 250 ns, which is longer than that of the element 1 (about 70 ns). However, given the nature of the breakdown, it is difficult to ensure that the breakdown start time of one element is exactly the same as that of the other element.

FIG. 11 shows one example of a forming process method in a memory cell array that includes a plurality of variable resistive elements. As for the forming in a memory array where a plurality of variable resistive elements are arranged, for example, as shown in FIG. 11, there is a method of sequentially applying a forming voltage pulse to each memory cell for the same period of time. One of gate voltages VW1 to VW3 of select transistors S1 to S3 is set to a High level, thereby selecting one of variable resistive elements R1 to R3. When a gate voltage V0 of a PMOS switch M0 is set to a Low level, V$_{FMG}$ is applied to a selected cell, and the forming is initiated. At this time, a forming current I$_{FMG}$ flows through the selected cell.

FIG. 12 shows a timing chart where the forming process is performed on R1, R2, and R3 in that order in the case of FIG. 11. Even if the same forming voltage pulse is applied, periods Δt1 to Δt3, which are the periods required for the breakdown to start, are different between the elements. After the breakdown of the variable resistive elements, the forming current continues to flow through the variable resistive elements until the applying of the forming voltage pulse is stopped. Therefore, periods u1 to u3, which are the periods during which the forming current flows after the breakdown, are different. The filament is formed by the breakdown, and a state in which resistance switching is possible is formed. However, if the periods u1 to u3, which are the periods during which the forming current flows, are different between the elements, a difference emerges between the elements in terms of the state of the filament. As a result, there is concern that a difference would occur between the elements in terms of resistance switching characteristics.

Therefore, what is desired is a nonvolatile semiconductor memory device in which variations of a forming current, which flows after breakdown, are reduced between elements.

SUMMARY

In one embodiment, there is provided a device that includes: a memory including a variable resistive memory cell including first and second terminals, a variable resistive memory element coupled between the first and second terminals, and a select transistor coupled between the second terminal and a first voltage line; and a capacitor circuit configured to be connected to the first terminal of the variable resistive memory cell when the select transistor is selected to be conductive between the second terminal and the first voltage line, the first terminal of the variable resistive memory cell being increased in voltage by the capacitor circuit to change a resistivity of the variable resistive memory element from a first level to a second level that is smaller than the first level.

In another embodiment, there is provided a device that includes: first and second data lines; a memory including a plurality of variable resistive memory cells each coupled between the first and second data lines; a first switch circuit; a charging circuit, and a capacitor being connected by the first switch circuit to the first data line after the capacitor has been connected by the first switch circuit to the charging circuit.

In still another embodiment, there is provided a device that includes: a switch circuit including first, second, and third node; a memory cell including a variable resistive memory element and a select transistor coupled in series to the first node of the switch circuit; a capacitor element coupled to the second node of the switch circuit; and a voltage source coupled to the third node of the switch circuit.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

First Embodiment

Figure 1:
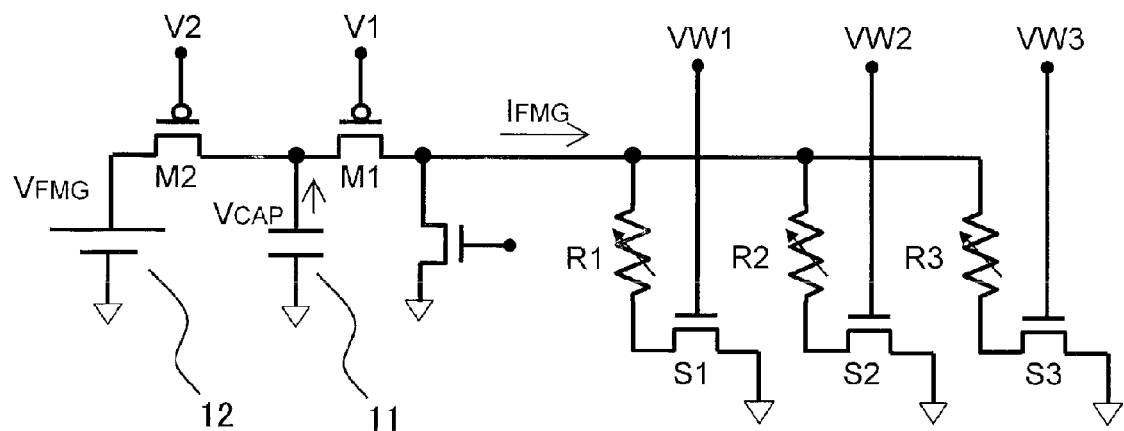
FIG. 1 is a circuit diagram showing main portions of a nonvolatile semiconductor memory device according to a first embodiment of the present invention.

FIG. 1 shows an exemplary circuit diagram of a nonvolatile semiconductor memory device according to a first embodiment of the present invention.

In the nonvolatile semiconductor memory device according to the first embodiment of the present invention shown in FIG. 1, a plurality of variable resistive elements R1 to R3 each are connected in series to corresponding select transistors S1 to S3, thereby forming a memory cell. Voltages VW1 to VW3 are applied to the gates of the select transistors to select memory cells. The voltages and currents necessary for forming of the variable resistive elements R1 to R3 are supplied from a capacitor 11. One end of the capacitor 11 is connected to the memory cells via a PMOS switch M1, as well as to a power source 12 via a PMOS switch M2. The other end of the capacitor 11 is connected to a reference potential (e.g. GND). In the example shown in FIG. 1, PMOS transistors are used as switches M1 and M2. However, NMOS transistors may be used to form the switches M1 and M2.

The variable resistive elements R1 to R3 are elements in which electrodes are held at both ends of a variable resistor, which is for example made of transition metal oxide or the like. As for the material for the variable resistor, the following are available among other things: oxides or oxynitrides, such as Al, Hf, Ni, Co, Ta, Zr, W, Ti, Cu, V, Zn, and Nb; or strontium titanate ($SrTiO_x$). According to the first embodiment, what is expected is a so-called bipolar-type element, in which a process of rewriting is performed by applying voltage pulses that are opposite to each other in terms of polarity for decreasing and increasing of resistance. However, the nonvolatile semiconductor memory device of the present invention does not necessarily use a variable resistive element of the above configuration.

If the above metal oxides are used as the material for variable resistors, the initial resistance of variable resistive elements is very high immediately after the variable resistive elements are produced, and the variable resistive elements are not in a state (variable resistance state) in which the variable resistive elements can switch between a high-resistance state and a low-resistance state depending on voltage stress. In order for the variable resistive elements to be turned into a variable resistance state, the following voltage pulse needs to be applied to a initial-state variable resistive element that has just been produced to form a current path where resistance switching can occur: a voltage pulse whose voltage amplitude is larger than a voltage pulse that is used for a normal rewriting operation, and whose pulse width is long. The above process, i.e. a process of applying an initialization voltage stress to the initial-state variable resistive element that has just been produced, is called forming process. A current path (called filament) that is formed by the forming process is known to determine switching characteristics of the element afterward.

According to the first embodiment, when the forming process of the variable resistive elements R1 to R3 is performed, the capacitor 11 that has been charged in advance is used to apply a voltage required for the forming, as well as to supply a current required for the forming.

When the charged capacitor 11 is connected to a variable resistive element that is in an initial high-resistance state before the forming process, almost no current flows therethrough because the variable resistive element is in the initial high-resistance state at first. Until the breakdown occurs, a voltage continues to be applied to the variable resistive element by the charged voltage $V_{CAP}$ of the capacitor 11. After the breakdown starts, the resistance of the variable resistive element is lowered, allowing a forming current $I_{FMG}$ to flow therethrough. As the forming current $I_{FMG}$ flows, the charged electric charge of the capacitor 11 decreases, and the charged voltage of the capacitor 11 declines. After the capacitor 11 is completely discharged, no current flows therethrough.

That is, the discharging of the capacitor 11 starts at the same time when the breakdown is started. When the capacitor 11 runs out of electric charge, the forming is automatically completed. Therefore, even if the breakdown start time is different between the elements, the periods during which the forming current $I_{FMG}$ flows are equal.

Figure 2:
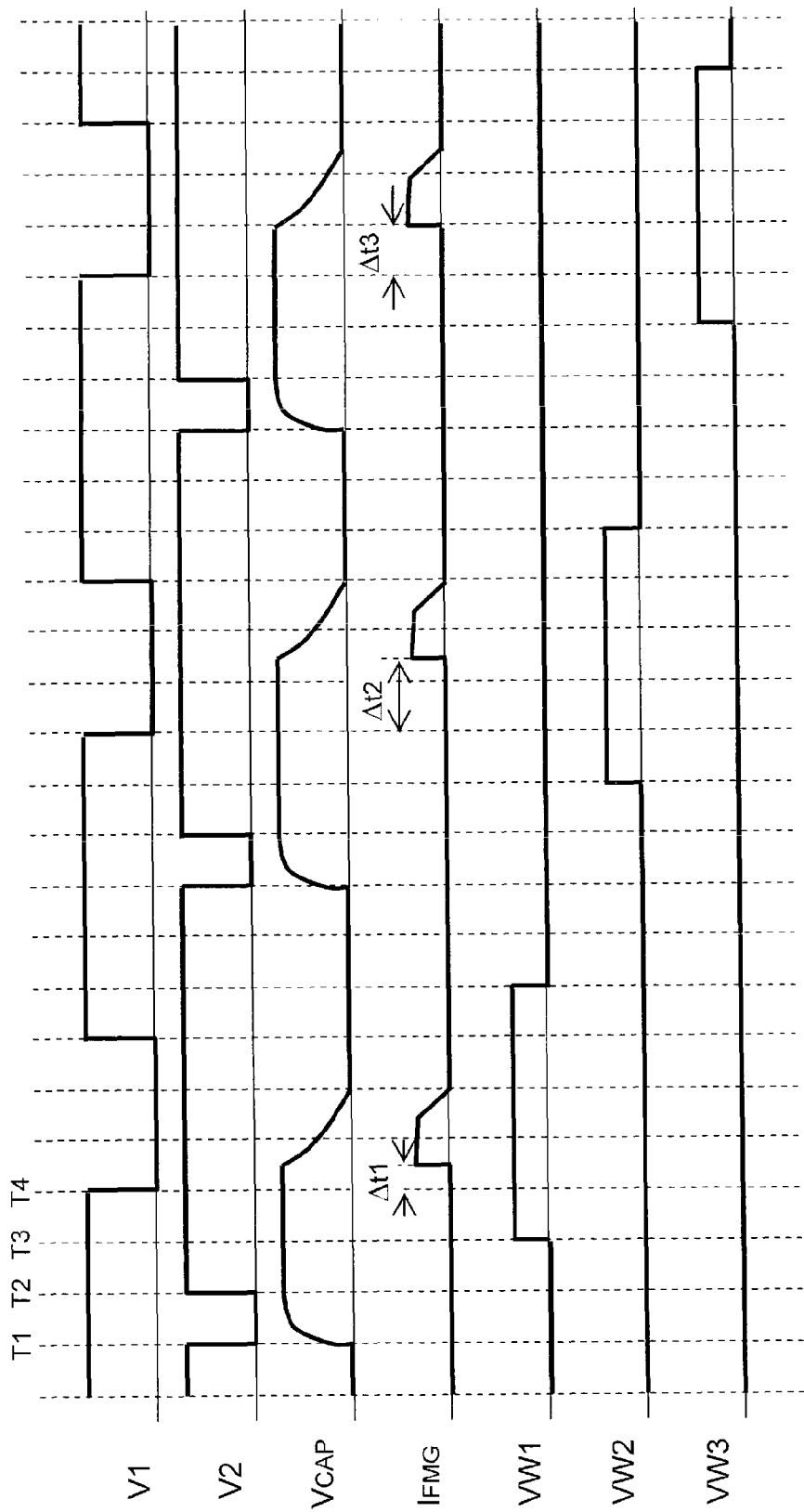
FIG. 2 is a timing chart of the case where variable resistive elements R1 to R3 shown in FIG. 1 are sequentially subjected to forming.

FIG. 2 shows an exemplary timing chart where the variable resistive elements R1 to R3 shown in FIG. 1 are sequentially subjected to the forming.

First, at time T1 in FIG. 2, the gate voltage V1 of the PMOS switch M1 is set to a High level, and the gate voltage V2 of the PMOS switch M2 to a Low level. At a time when the capacitor 11 is being separated from each memory cell, one end of the capacitor 11 is connected to the power source 12, which is designed to supply the forming voltage. The capacitor 11 is charged until the voltage of the capacitor 11 reaches a power-source voltage $V_{FMG}$ of the power source 12.

Then, at time T2 in FIG. 2, the gate voltage V2 is set to a High level, and the capacitor 11 is disconnected from the power source 12. At this time, the capacitor 11 has been charged in such a way that the potential $V_{CAP}$ of one end of the capacitor 11 reaches $V_{FMG}$.

Then, at time T3 in FIG. 2, in order to select the variable resistive element R1, the gate voltage VW1 is raised to a High level. As for the gate voltage VW1 at this time, the voltage applied to the gate of the select transistor S1 is preferably set in such a way that the forming current that flows after the breakdown can be so limited as to be less than or equal to a predetermined value (e.g. about 50 μA). As the forming current is limited to a low current, a narrower filament is formed. As a result, a switching operation is possible at lower current.

After that, at time T4 in FIG. 2, the gate voltage V1 is set to a Low level. Accordingly, one end of the capacitor 11 is connected to one end of the variable resistive element R1. The voltage $V_{CAP}$ of the capacitor 11 is applied to the variable resistive element R1 that is in an initial state. At this time, since the variable resistive element R1 is in an initial high-resistance state, almost no current flows therethrough. Therefore, the capacitor 11 is not discharged, and the voltage $V_{CAP}$ of the capacitor 11 remains at $V_{FMG}$.

After a certain time (Δt1) has passed since time T4, the breakdown occurs at the variable resistive element R1. Then, as the capacitor 11 is discharged, the forming current $I_{FMG}$ flows. The voltage $V_{CAP}$ of the capacitor 11 gradually drops from $V_{FMG}$. After a certain period of time has passed, at a time when the capacitor 11 is completely discharged, the forming is automatically completed. Then, at time T5 after the forming is completed, the gate voltage V1 is set back to a High level. Furthermore, at time T6, the gate voltage VW1 is set back to a Low level.

Thereafter, a procedure of charging the capacitor 11 and applying the voltage to the variable resistive elements is repeated. In this manner, the forming of the variable resistive elements R2 and R3 is similarly performed.

Figure 12:
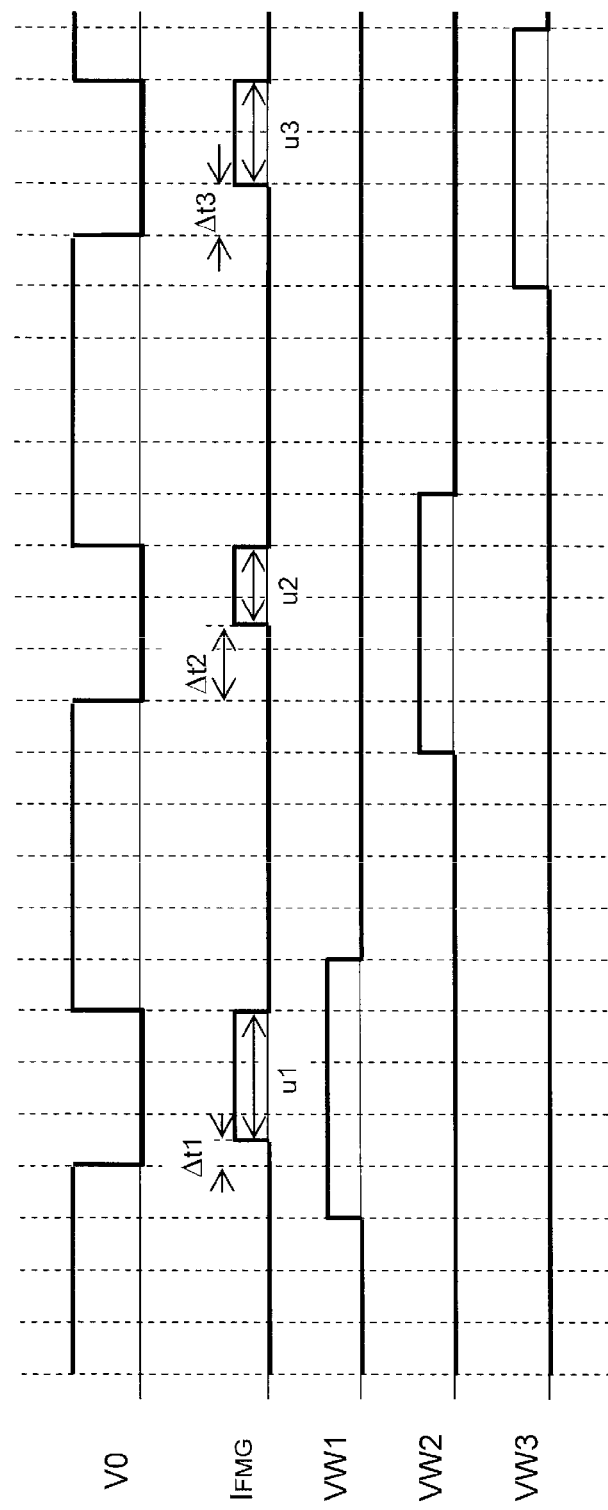
FIG. 12 is a timing chart for explaining a forming process method according to the conventional art.

In the case of FIG. 2, the periods of time from when the forming voltage is supplied to the variable resistive elements R1 to R3 until when the breakdown starts are Δt1 to Δt3, respectively, which are different from each other. However, because electric charge is supplied from the capacitor 11, the waveforms of the current $I_{FMG}$ that flows after the start of the breakdown can be so controlled as to be substantially identical. For example, in the case of FIG. 12, the periods u1 to u3 during which the current flows are different from each other, because the periods (Δt1 to Δt3), which are the periods from when the voltage pulse starts to be applied until when the breakdown starts as described above, are different between the elements. However, in the case of FIG. 2, the periods during which the current $I_{FMG}$ flows are constant (or substantially equal to each other) between the elements.

As a result, it is possible to reduce variations of the elements that are in the state of filaments formed, and reduce variations of the subsequent resistance switching operation between the elements.

In this case, the capacitance of the capacitor 11 may be so set that a required forming current can flow for a required period of time. The amount of electric charge required for a current of $I_{FMG}$ [A] to flow for t seconds is $I_{FMG}$·t coulomb. Accordingly, if the forming voltage is represented by $V_{FMG}$, the required capacitance is $I_{FMG}$·t/$V_{FMG}$ farad. However, given parasitic capacitances of the variable resistive elements and wiring, all the electric charge stored in the capacitor 11 are not necessarily discharged and used as the forming current. Therefore, it is preferred that the capacitance be set higher than the above calculated value (or, for example, within a range of values leading up to ten times as large as the above calculated value).

The configuration of the capacitor 11 may be that of what is commonly used. However, in order to reduce the area, a capacitor using an insulating film that is high in relative permittivity is more preferred.

Figure 3:
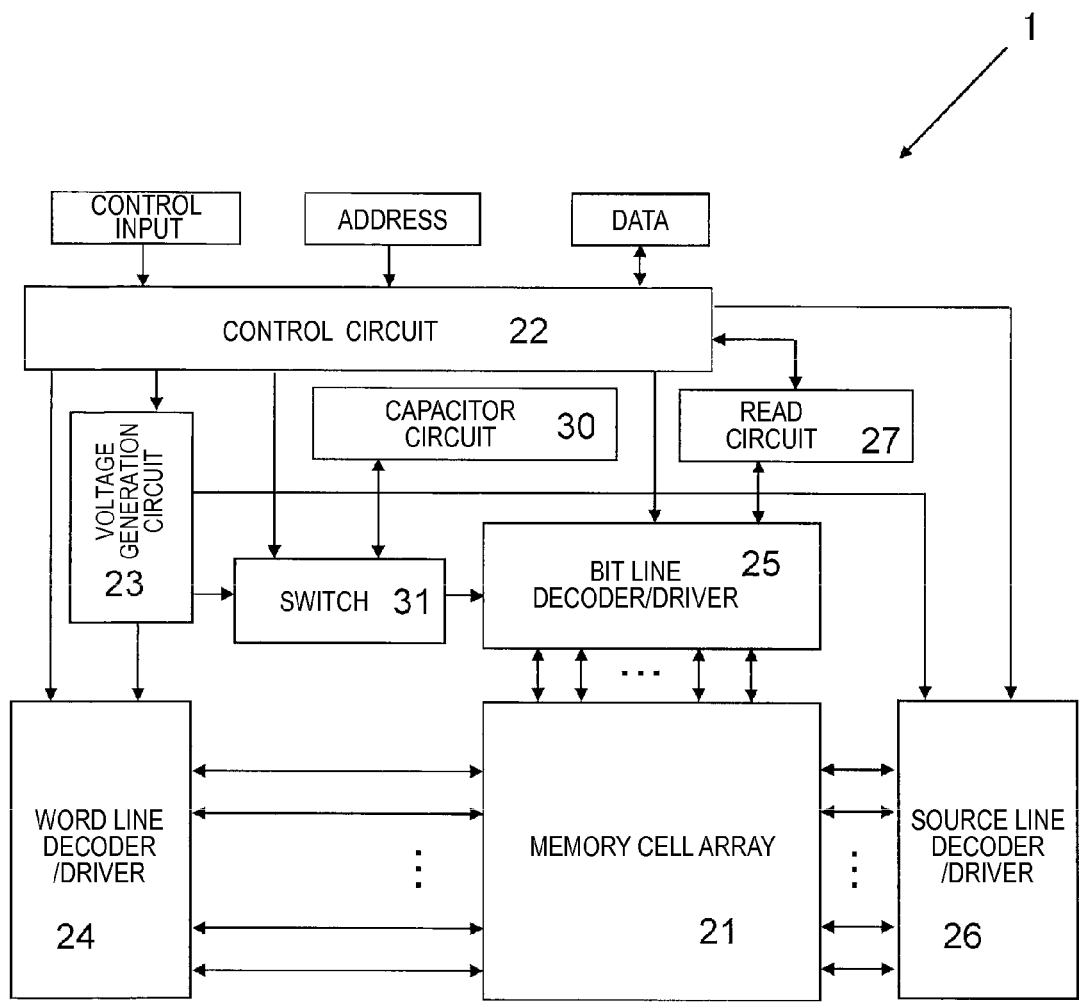
FIG. 3 is a block diagram of the overall schematic configuration of a nonvolatile semiconductor memory device that includes a memory cell array in which a plurality of memory cells having variable resistive elements shown in FIG. 1 are arranged.

FIG. 3 shows a exemplary block diagram of the overall schematic configuration of a nonvolatile semiconductor memory device that includes a memory cell array in which a plurality of memory cells having the above variable resistive elements are arranged.

The nonvolatile semiconductor memory device 1 shown in FIG. 3 includes the following components around a memory cell array 21 in which a plurality of memory cells containing variable resistive elements are arranged in a matrix pattern: a control circuit 22, a voltage generation circuit 23, a word line decoder/driver 24, a bit line decoder/ driver 25, a source line decoder/driver 26, a read circuit 27, a capacitor circuit 30, and a switch 31.

Figure 4:
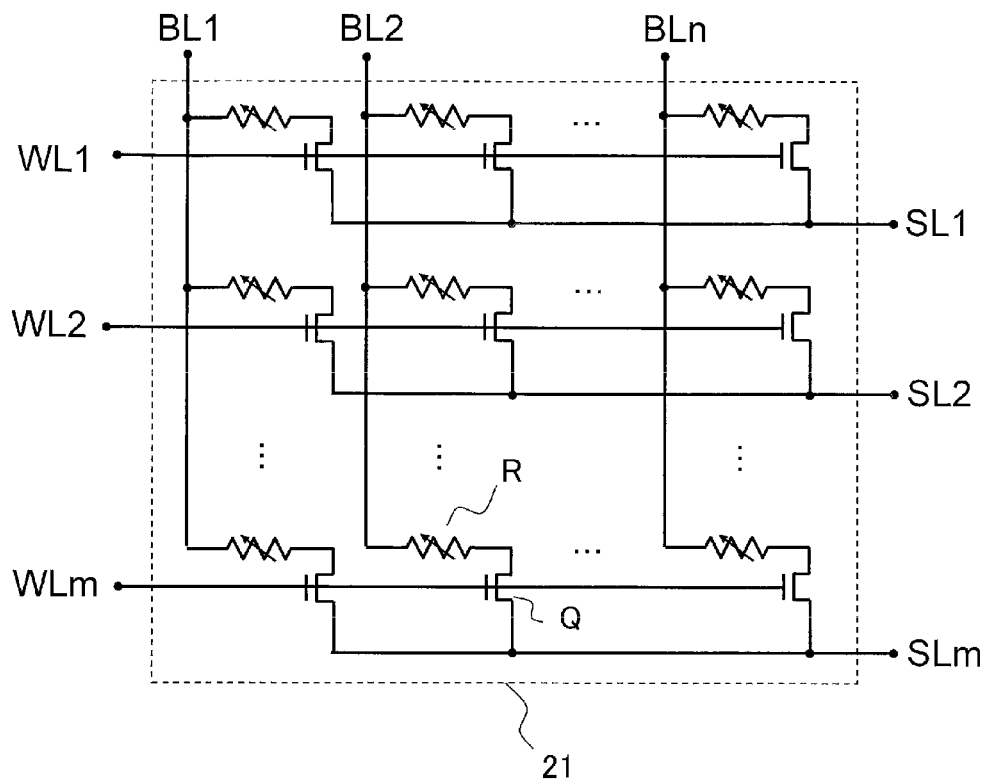
FIG. 4 is an equivalent circuit diagram indicative of an embodiment of the memory cell array shown in FIG. 3.

FIG. 4 shows, as one example, an equivalent circuit diagram of the memory cell array 21. In the memory cell array 21, a plurality of 1T/1R-type memory cells, in which a cell select transistor Q and a variable resistive element R are connected in series, are arranged in a matrix pattern. One end of each memory cell on the side of the variable resistive element R is connected to bit lines BL1 to BLn ("n" is a natural number), which extend in a column direction (or in the vertical direction of FIG. 4). The other end of each memory cell on the side of the cell select transistor Q is connected to source lines SL1 to SLm ("m" is a natural number greater than or equal to 2), which extend in a row direction (or in the horizontal direction of FIG. 4). The gate terminal of each cell select transistor Q is connected to word lines WL1 to WLm, which extend in the row direction. That is, the memory cell array 21 is so structured that the memory cells are disposed at intersection points of the n bit lines BL1 to BLn, which extend in the column direction, and the m word lines, which extend in the row direction. A selection word line voltage or non-selection word line voltage is separately applied via a word line. A selection bit line voltage or non-selection bit line voltage is separately applied via a bit line. A selection source line voltage or non-selection source line voltage is separately applied via a source line. Therefore, during a writing operation, an erasing operation, a reading operation, or a forming process, one or a plurality of to-be-operated memory cells specified by an address input from outside can be selected.

The control circuit 22 controls a writing operation (lowering resistance: set), an erasing operation (increasing resistance: reset), a reading operation, and a forming process in the memory cell array 21. More specifically, on the basis of an address signal that is input from an address line, data (at the time of writing and erasing) that is input from a data line, and a control input signal that is input from a control signal line, the control circuit 22 controls the word line decoder/driver 24, the bit line decoder/driver 25, the source line decoder/driver 26, and the switch 31, and controls each operation of the memory cell array 21. Incidentally, in the example shown in FIG. 3, although not shown in the diagram, the control circuit 22 has the functions of a typical address buffer circuit, data input/output buffer circuit, and control input buffer circuit.

The voltage generation circuit 23 generates a voltage required for each operation during the writing operation (lowering resistance: set), the erasing operation (increasing resistance: reset), the reading operation, and the forming process. The voltage generation circuit 23 then supplies the voltage to the word line decoder/driver 24, the bit line decoder/driver 25, and the source line decoder/driver 26. In particular, during the reading operation, the voltage generation circuit 23 functions as a reading voltage applying circuit that applies a predetermined reading voltage to a bit line, word line, and source line that are connected to a selected memory cell via the bit line decoder/driver 25, the source line decoder/driver 26, and the word line decoder/driver 24.

The word line decoder/driver 24, the bit line decoder/driver 25, and the source line decoder/driver 26 have the function of a memory cell selection circuit to select at least one corresponding memory cell in the memory cell array 21 on the basis of an address signal that is input into the control circuit 22. When a to-be-operated memory cell is specified by an address signal input into an address line during the writing operation (lowering resistance: set), the erasing operation (increasing resistance: reset), the reading operation, and the forming process, the word line decoder/driver 24 selects a word line corresponding to the address signal input into the address line, and separately applies the selection word line voltage and the non-selection word line voltage to the selected word line and the unselected word lines, respectively.

When a to-be-operated memory cell is specified by an address signal input into an address line during the writing operation (lowering resistance: set), the erasing operation (increasing resistance: reset), the reading operation, and the forming process, the bit line decoder/driver 25 selects a bit line corresponding to the address signal input into the address line, and applies the selection bit line voltage to the selected bit line. In the example shown in FIG. 3, particularly at the time of the forming process, the bit line decoder/driver 25 functions as a voltage applying circuit to apply a voltage required for the forming process, which is supplied from the capacitor circuit 30, to one end of a variable resistive element of the selected memory cell via the selected bit line.

When a to-be-operated memory cell is specified by an address signal input into an address line during the writing operation (lowering resistance: set), the erasing operation (increasing resistance: reset), the reading operation, and the forming process, the source line decoder/driver 26 selects a source line corresponding to the address signal input into the address line, and applies the selection source line voltage to the selected source line.

More specifically, in a typical example, in the case of the writing operation (lowering resistance: set), a voltage is applied to the selected bit line and the selected source line in such a way that a 50 nsec voltage pulse with a voltage of 1.5 V to 2.5 V is applied to both ends of a selected memory cell. In the case of the erasing operation (increasing resistance: reset), a voltage is applied to the selected bit line and the selected source line in such away that a 50 nsec voltage pulse with a voltage of −1.0 V to −1.5 V is applied to both ends of a selected memory cell.

Moreover, in the lowering-resistance (set) operation, in order to reduce variations in the resistance value after a change in resistance, it is preferred that the current flowing through a variable resistive element be restricted by a cell select transistor so as to be smaller, and that the resistance of the variable resistive element be lowered. On the other hand, in the increasing-resistance (reset) operation, in terms of stable operation, it is preferred that, in the situation where the current is not restricted by a transistor as much as possible, a large amount of current flow through a variable resistive element, and that the resistance of the variable resistive element be increased. Accordingly, it is preferred that the selection word line voltage during the increasing-resistance (reset) operation be higher than the selection word line voltage during the lowering-resistance (set) operation.

As described later in FIGS. 5A, 5B, and 6, the capacitor circuit 30 includes at least one capacitor. One end of the capacitor is connected to the voltage generation circuit 23 and the bit line decoder/driver 25 via the switch 31. Incidentally, the other end of the capacitor is connected to a reference potential (e.g., GND). During the forming operation, the switch 31 switches the connection destination of one end of the capacitor under the control of the control circuit 22 between the voltage generation circuit 23 and the bit line decoder/driver 25.

Figure 5A:
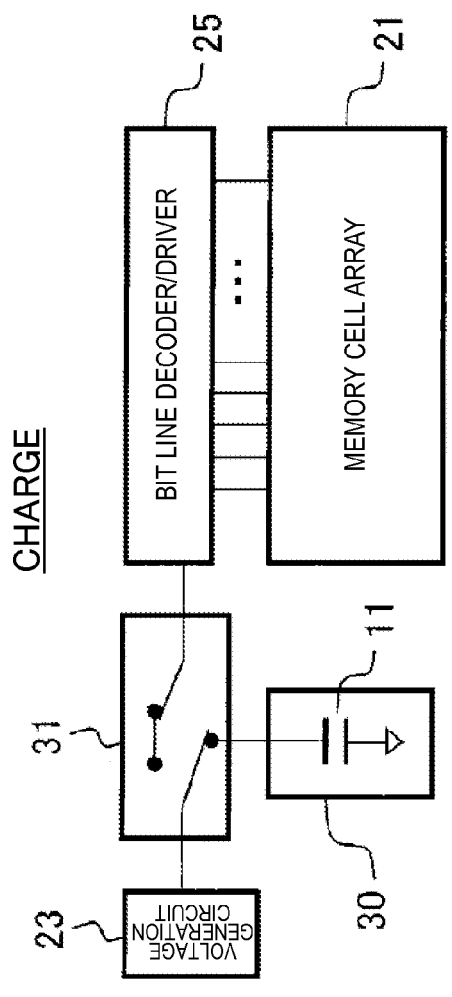
FIGS. 5A and 5B are diagrams indicative of an embodiment of an operation at a time when a forming process of the nonvolatile semiconductor memory device shown in FIG. 3 is performed.
Figure 5B:
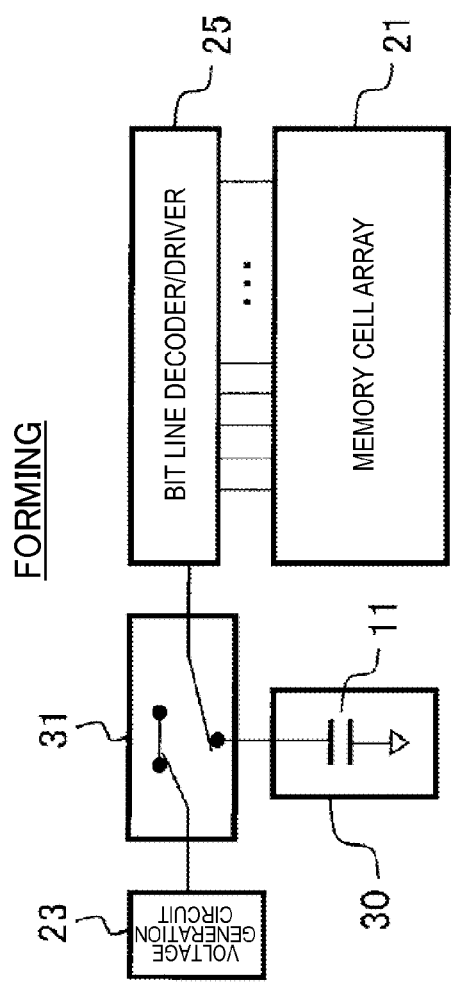
Figure 6:
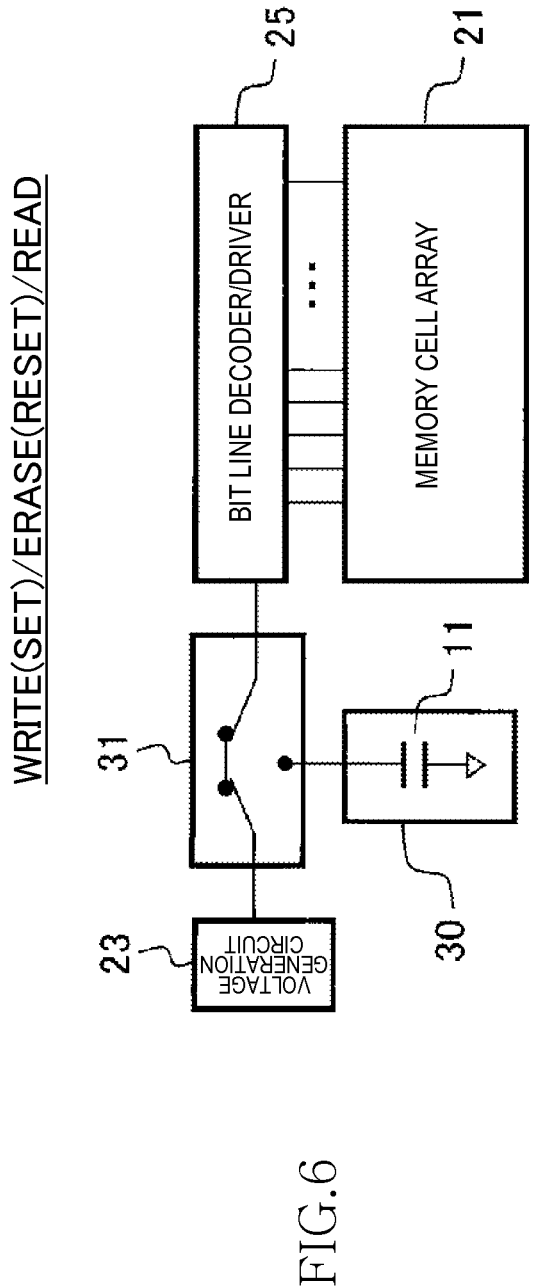
FIG. 6 is a diagram indicative of an embodiment of an operation at a time when a normal rewriting operation of the nonvolatile semiconductor memory device shown in FIG. 3 is performed.

The following describes an operation at a time when the forming process of the nonvolatile semiconductor memory device 1 is performed with reference to FIGS. 5A and 5B.

The control circuit 22 identifies, on the basis of an address signal, a memory cell that will be subjected to the forming process. Then, the control circuit 22 controls the word line decoder/driver 24, the bit line decoder/driver 25, and the source line decoder/driver 26 to apply voltage to a selected word line, a selected bit line, and a selected source line in such a way that a required voltage is applied to a variable resistive element of the selected memory cell.

As for the voltage applied to the selected bit line, a forming voltage generated by the voltage generation circuit 23 is not supplied directly to the bit line decoder/driver 25. As shown in FIG. 5A, the control circuit 22 controls the switch 31, and connects one end of the capacitor 11 in the capacitor circuit 30 to the voltage generation circuit 23, and charges the capacitor 11 with the forming voltage.

After the charging of the capacitor 11 is completed, as shown in FIG. 5B, the control circuit 22 controls the switch 31, and switches the connection destination of one end of the capacitor 11 in the capacitor circuit 30 to the bit line decoder/driver 25. As a result, the voltage of the charged capacitor 11 is applied to the selected bit line.

Meanwhile, during the writing operation (lowering resistance: set), the erasing operation (increasing resistance: reset), and the reading operation, the capacitor circuit 31 is not used. Therefore, as shown in FIG. 6, the control circuit 22 controls the switch 31 in such a way that the voltage generation circuit 23 is connected directly to the bit line decoder/driver 25, and disconnects the capacitor circuit 30 from the voltage generation circuit 23 and the bit line decoder/driver 25.

In that manner, the forming process operation is controlled. Therefore, as described above, the amount and waveform of the forming current that flows through variable resistive elements after the start of the breakdown are so controlled as to be substantially the same between all the variable resistive elements in the memory cell array 21. As a result, it is possible to reduce variations of the elements that are in the state of filaments formed, and reduce variations of the subsequent resistance switching operation between the elements.

Incidentally, the detailed circuit configurations, device configurations, and production methods of the control circuit 22, voltage generation circuit 23, word line decoder/driver 24, bit line decoder/driver 25, source line decoder/driver 26, and read circuit 27 are feasible with the use of publicly-known circuit configurations, and can be produced with the use of publicly-known semiconductor manufacturing technology. Therefore, the description of the above components will be omitted.

Second Embodiment

What is described in the above first embodiment is an example in which, during the forming process, the capacitor circuit 30 is used, and the forming voltage and current are supplied via the charged capacitor. Meanwhile, the transition (set operation) of the variable resistive elements from a high-resistance state to a low-resistance state is considered to be the same physical phenomenon as the forming. At the time of the lowering-resistance operation, the capacitor circuit 30 can be used.

In this case, if the amount of electric charge required for the forming process is different from the amount of electric charge required for the set operation, a plurality of capacitors can be used, and it is possible to switch between capacitors used for the forming process and capacitors used for the set operation. Alternatively, it is also preferred that all the plurality of capacitors be used during the forming process, and that some of the capacitors be used during the set operation. That is, it is preferred that the capacitance of capacitors used be switched for the forming process and the set operation.

FIGS. 7A, 7B, 8A, and 8B show operations at a time when the forming process and lowering-resistance (set) operation of the nonvolatile semiconductor memory device 1 are performed in the case where the capacitor circuit 30 includes a plurality of capacitors.

The capacitor circuit 30 includes a plurality of capacitors 11a to 11n. The capacitors 11a to 11n are connected in parallel via switches 32a to 32n, which are separately provided. One ends of the capacitors 11a to 11n each are connected to the switch 31 via the switches 32a to 32n, and are connected to the voltage generation circuit 23 or the bit line decoder/driver 25 via the switch 31. The other ends of the capacitors 11a to 11n each are connected to a reference potential (e.g., GND).

Figure 7A:
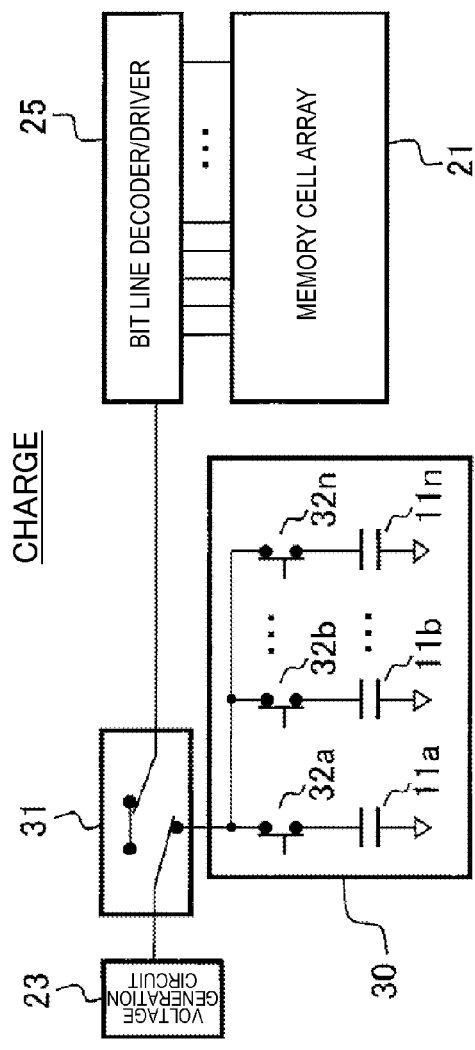
FIGS. 7A and 7B are diagrams indicative of an embodiment of an operation at a time when a forming process of the nonvolatile semiconductor memory device 1 shown in FIG. 3 is performed in the case where a capacitor circuit includes a plurality of capacitors.
Figure 7B:
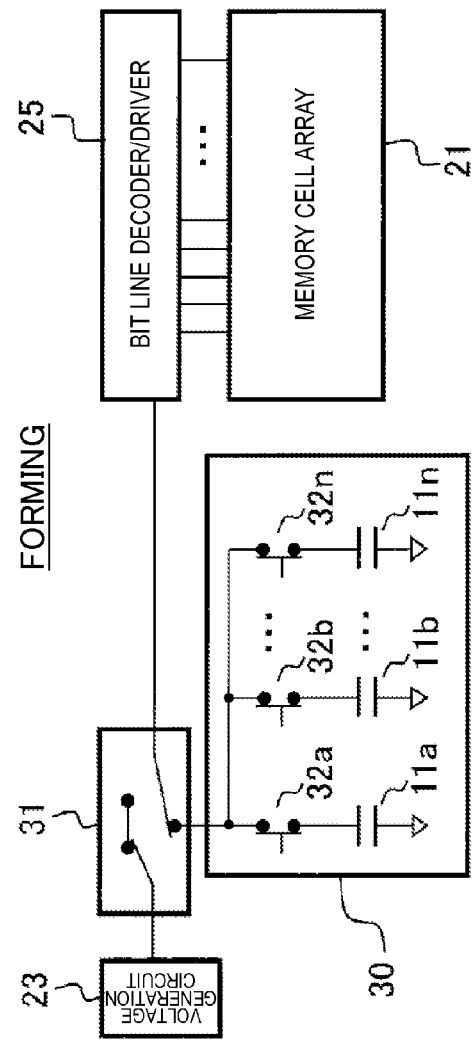

During the forming process, as shown in FIGS. 7A and 7B, all the switches 32a to 32n are turned ON, and all the plurality of capacitors 11a to 11n are used to apply a forming voltage.

That is, as shown in FIG. 7A, the control circuit 22 controls the switch 31, and connects one ends of the capacitors 11a to 11n in the capacitor circuit 30 to the voltage generation circuit 23, thereby charging all the capacitors 11a to 11n with the forming voltage. After that, as shown in FIG. 7B, the control circuit 22 controls the switch 31, and switches the connection destination of all the one ends of the capacitors 11a to 11n in the capacitor circuit 30 to the bit line decoder/driver 25. As a result, the voltage of the charged capacitors 11a to 11n is applied to a selected bit line.

Figure 8A:
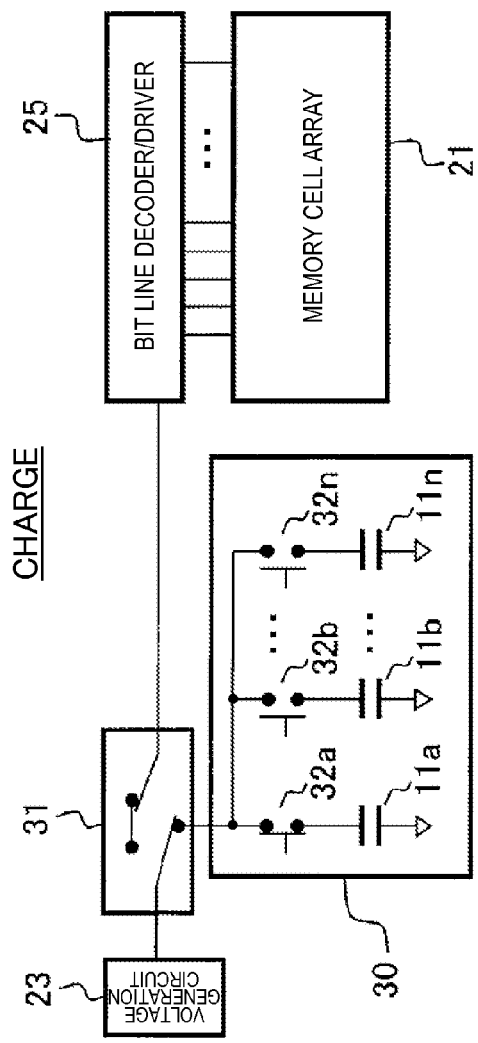
FIGS. 8A and 8B are diagrams indicative of an embodiment of an operation at a time when a lowering-resistance (set) operation of the nonvolatile semiconductor memory device shown in FIG. 3 is performed in the case where a capacitor circuit includes a plurality of capacitors.
Figure 8B:
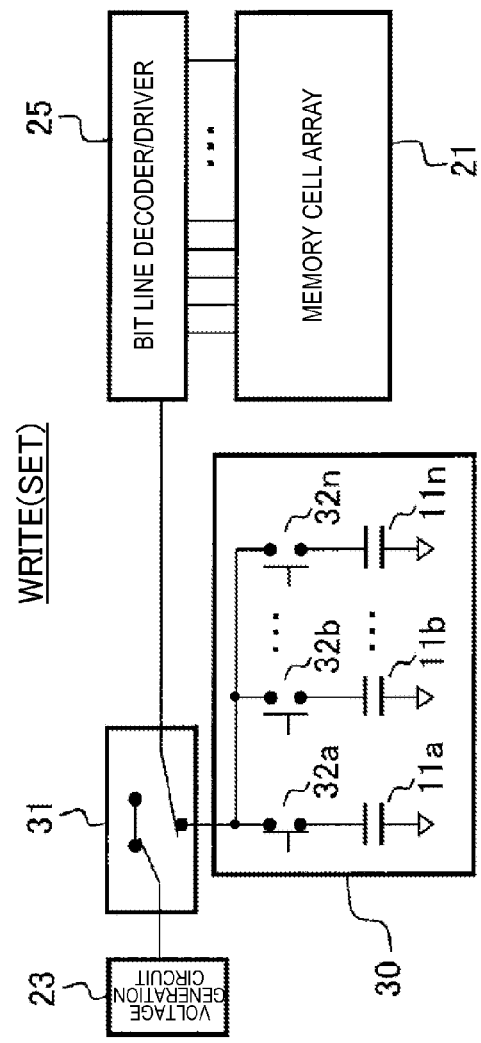

On the other hand, during the lowering-resistance (set) operation, as shown in FIGS. 8A and 8B, only the capacitor 11a is used to apply a set voltage. Accordingly, among the switches 32a to 32n, the switch 32a is turned ON, and the other switches OFF.

That is, as shown in FIG. 8A, the control circuit 22 controls the switch 31, and connects one end of the capacitor 11a in the capacitor circuit 30 to the voltage generation circuit 23, thereby charging the capacitor 11a with the set voltage. The capacitors 11b to 11n are not charged. After that, as shown in FIG. 8B, the control circuit 22 controls the switch 31, and switches the connection destination of one end of the capacitor 11a in the capacitor circuit 30 to the bit line decoder/driver 25. As a result, the voltage of the charged capacitor 11a is applied to a selected bit line.

Figure 9:
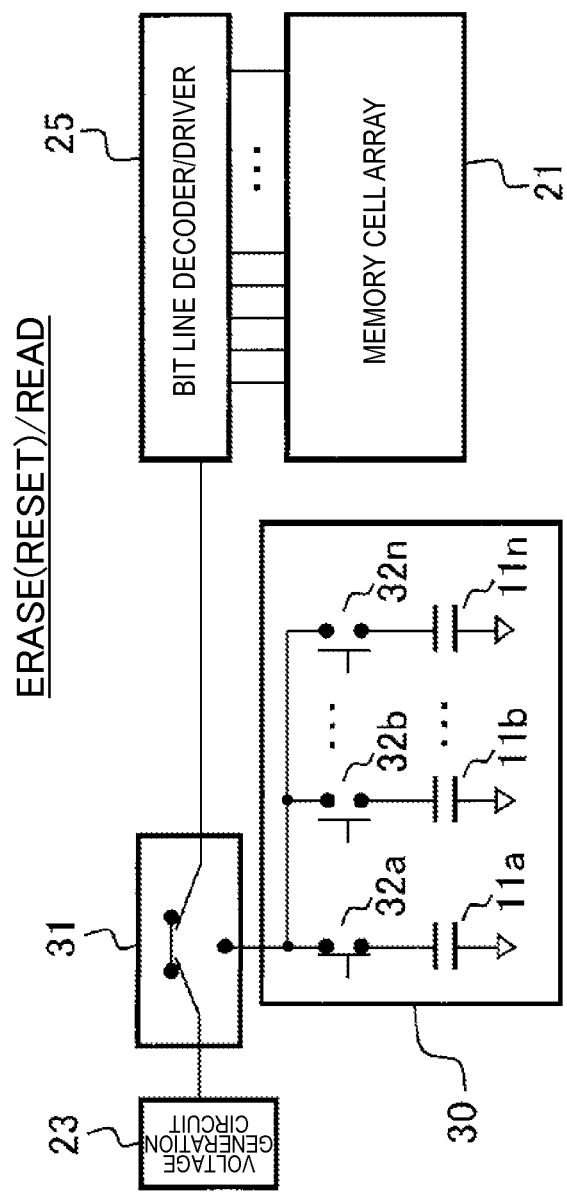
FIG. 9 is a diagram indicative of an embodiment of an operation at a time when an erasing operation and reading operation of the nonvolatile semiconductor memory device shown in FIG. 3 is performed in the case where a capacitor circuit includes a plurality of capacitors.
Figure 10:
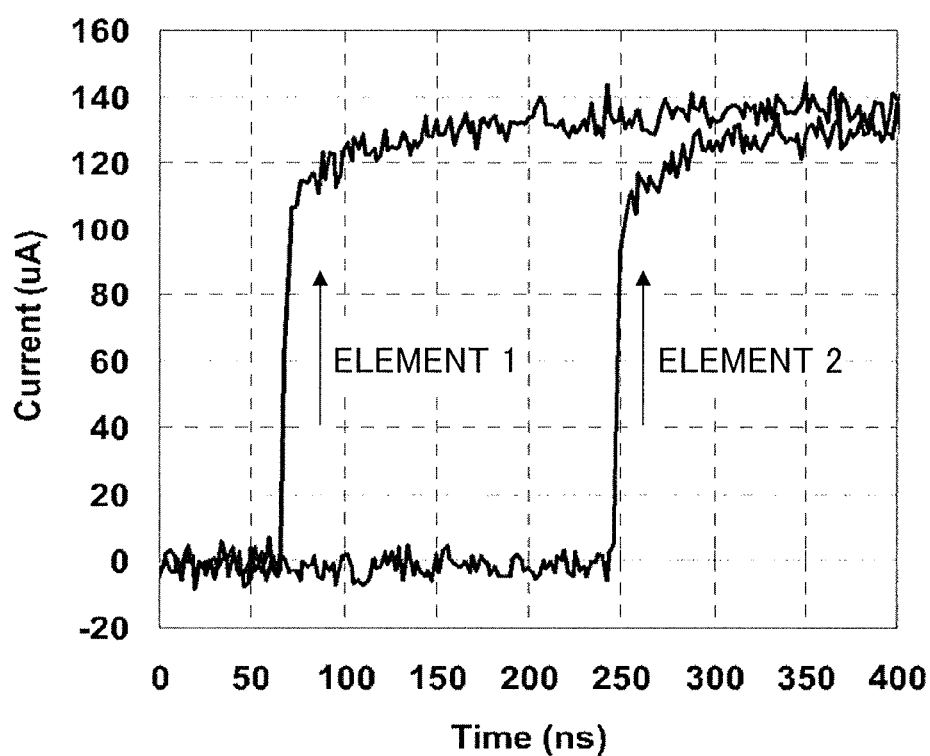
FIG. 10 is a graph indicative of time changes of currents flowing through variable resistive elements in a forming process.
Figure 11:
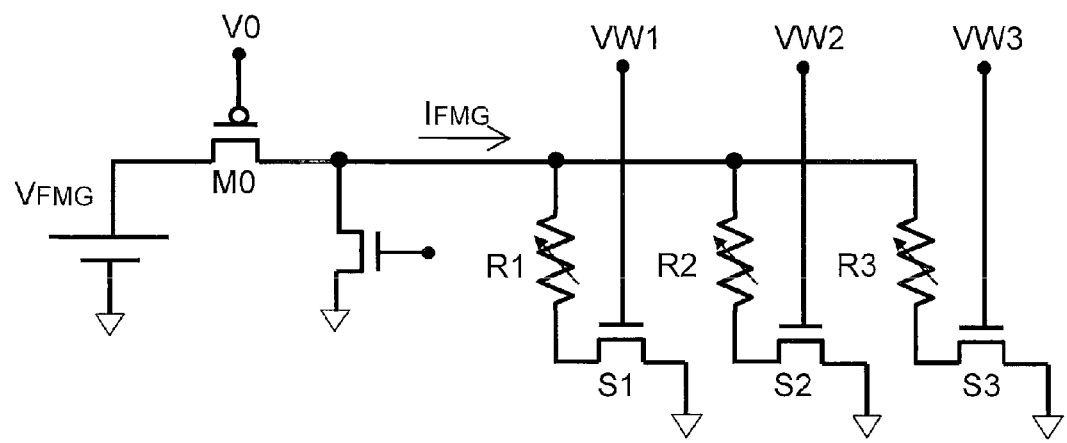
FIG. 11 is a circuit diagram for explaining a forming process method according to a conventional art.

Meanwhile, during the erasing operation (increasing resistance: reset) and the reading operation, the capacitor circuit 31 is not used. Therefore, as shown in FIG. 9, the control circuit 22 controls the switch 31 in such a way that the voltage generation circuit 23 is connected directly to the bit line decoder/driver 25, and disconnects all the capacitors 11a to 11n in the capacitor circuit 30 from the voltage generation circuit 23 and the bit line decoder/driver 25.

In that manner, the forming process operation is controlled. Therefore, as described above, it is possible to reduce variations of the elements that are in the state of filaments formed by the forming process, and reduce variations of the subsequent resistance switching operation between the elements. Furthermore, according to the second embodiment, even during the set operation, the capacitor circuit 30 is used. Therefore, it is possible to further reduce variations between the elements that are in a low-resistance state after the set operation.

According to the above first and second embodiments, it is possible to realize a resistance control method of variable resistive elements that can reduce variations of resistance switching characteristics between the elements, and a highly-reliable nonvolatile semiconductor memory device that can reduce variations of resistance switching characteristics between the elements.

Hereinafter, several other embodiments will be described.

<1> What is described in the above second embodiment is: that since the capacitor circuit 30 includes a plurality of capacitors 11a to 11n, the capacitance of capacitors is variable; and a method of changing the capacitance of capacitors used in the forming process and the set operation. However, the configuration of the case where a plurality of capacitors are provided is not limited to the above configuration.

For example, the following configuration is possible: switches 31 are provided for each of a plurality of capacitors, and the connection destination of one end of each capacitor can be switched between the voltage generation circuit 23 and the bit line decoder/driver 25. According to the configuration, while one of at least two capacitors is connected to the voltage generation circuit 23 and is charged, the other capacitor can be connected to the bit line decoder/driver 25 and be used for the forming process of a variable resistive element of a memory cell. Therefore, after the forming process of the variable resistive element of the memory cell is completed, the charged capacitor can be promptly connected to the bit line decoder/driver 25 to start applying, without a pause, a forming voltage to a variable resistive element of the next to-be-operated memory cell. Therefore, it is possible to increase the throughput of the forming process for a plurality of variable resistive elements.

<2> Moreover, the configuration in which a plurality of capacitors are provided for each bit line is also possible. If the forming process is performed on variable resistive elements of a plurality of memory cells connected to a common word line, after the forming process of a memory cell connected to a selected bit line is completed, a new bit line is selected, and the forming process of the next memory cell is initiated. At this time, the charged capacitor can be used to start applying, without a pause, voltage to a variable resistive element of the newly-selected memory cell. Therefore, it is possible to increase the throughput of the forming process for a plurality of variable resistive elements connected to a common word line.

<3> Furthermore, depending on the characteristics of variable resistive elements, and parasitic capacitance components between the bit line decoder/driver 25 and memory cells, a plurality of capacitors can be switched to change the amount of electric charge necessary for the lowering-resistance operation (the forming operation and the set operation). For example, when it is clear that, given the manufacturing process, the forming characteristics are different at a specific location of the memory cell array 21, the present invention may also be used to switch the capacitance of capacitors depending on the location of a selected memory cell, or switch the capacitance of capacitors depending on the location of a selected bit line.

<4> According to the above embodiments, as for the configuration of the nonvolatile semiconductor memory device 1, what is shown as an example is the case where the memory cell array 21 includes the 1T1R-type memory cells. However, the present invention is not limited by the configuration of the memory cell array 21. Moreover, the present invention is not limited by the circuit configurations of the control circuit 22, decoders/drivers 24 to 26, and other components. For example, the present invention also can be applied to: a memory cell array of a 1R type, in which memory cells are made up of only variable resistive elements; and a memory cell array of a 1D1R type, in which memory cells are made up of variable resistive elements to which a two terminal-type current limiting element, such as a diode or varistor, is connected in series.

In the case of FIG. 4, one end of a memory cell on the side of a variable resistive element R is connected to a bit line, and the other end of the memory cell on the side of a cell select transistor Q is connected to a source line. However, the memory cell may be connected the other way around. That is, one end of the memory cell on the side of the variable resistive element R may be connected to the source line, and the other end of the memory cell on the side of the cell select transistor Q may be connected to the bit line. Furthermore, in the case of FIG. 4, the source lines extend in the row direction, i.e. in the direction perpendicular to the bit lines. However, the source lines may extend in the column direction, i.e. in the direction parallel to the bit lines.

Moreover, the nonvolatile semiconductor memory device 1 includes the source line decoder/driver 26 that is used to select each of the source lines SL1 to SLn, and is so configured as to separately select the source lines and be able to apply the voltage necessary for the operation of a memory cell. However, the following configuration is also possible: a common source line is shared by all the memory cells, and a predetermined fixed potential (e.g. ground voltage) is supplied to the source line. Even in this case, it is possible to supply the voltage necessary for the operation of a memory cell by separately selecting the bit lines BL1 to BLn via the bit line decoder/driver 25.

<5> The present invention can be applied to variable resistive elements of a filament type in which a filament is formed by the forming process. The present invention is not restricted by the materials of variable resistors and electrodes that make up the variable resistive elements, the size of the elements, and other factors. The voltage values of voltage pulses and pulse widths (applying time) that are used in the description of the memory's operation in the above embodiments, and the procedure of the forming process operation shown in the timing chart of FIG. 2 are examples to explain the present invention, and are not intended to limit the present invention.

What is claimed is:

1. A device comprising:
   a memory cell including a variable resistive memory element;
   a capacitor including a first node and a second node;
   a voltage generation circuit; and
   a switch circuit including a first switch and a second switch, the first switch being coupled between the voltage generation circuit and the first node of the capacitor without an intervention of the second switch, the second switch being coupled between the first node of the capacitor and the memory cell without an intervention of the first switch, the first switch being configured to take an on-state during a first period of time and an off-state during a second period of time following the first period of time and the second switch being configured to take an off-state during the first period of time and an on-state during the second period of time; and
   a voltage node supplied with a fixed voltage, the voltage node being coupled to the second node of the capacitor to supply the fixed voltage to the second node of the capacitor during the first period of time and further being coupled to the second node of the capacitor to supply the fixed voltage to the second node of the capacitor during the second period of time.

2. The device of claim 1, wherein the memory cell further includes a select transistor coupled to the variable resistive memory element without an intervention of the second switch.

3. The device of claim 2, wherein the select transistor is configured to take an on-state during a third period of time following the first period of time and the third period of time includes all of the second period of time and longer than the second period of time.

4. The device of claim 3, wherein the select transistor is configured to take an off-state during the first period of time.

5. The device of claim 1, wherein the capacitor is configured to be variable in capacity.

6. The device of claim 1, wherein the variable resistive memory element is changed to be lower in resistance value during the second period of time.

7. A device comprising:
   a memory cell including a variable resistive memory element
   a capacitor including a first node and a second node;
   a voltage generation circuit; and
   a switch circuit including a first transistor and a second transistor, the first transistor being coupled between the voltage generation circuit and the first node of the capacitor without an intervention of the second transistor, the second transistor being coupled between the first node of the capacitor and the memory cell without an intervention of the first transistor, the first transistor being configured to turn on to allow the voltage generation circuit to charge the capacitor while the second transistor is being turned off to electrically isolate the memory cell from both of the capacitor and the voltage generation circuit, the second transistor being configured to turn on to allow the capacitor to electrically connect with the memory cell while the first transistor is being turned off to electrically isolate the capacitor from the voltage generation circuit; and
   a voltage node supplied with a fixed voltage, the voltage node being coupled to the second node of the capacitor to supply the fixed voltage to the second node of the capacitor while the first transistor turns on to allow the voltage generation circuit to charge the capacitor and further being coupled to the second node of the capacitor to supply the fixed voltage to the second node of the capacitor while the second transistor turns on to allow the capacitor to electrically connect with the memory cell.

8. The device of claim 7, wherein the memory cell further includes a select transistor coupled to the variable resistive memory element without an intervention of the second transistor.

9. The device of claim 8, wherein the select transistor is configured to turn on after the first transistor has turned from on to off and before the second transistor turns from off to on.

10. The device of claim 9, wherein the select transistor is configured to turn from on to off after the second transistor has turned from on to off.

11. The device of claim 7, wherein the capacitor is configured to be variable in capacity.

12. A device comprising;
   a memory cell including a variable resistive memory element and a select transistor;
   a capacitor;
   a voltage generation circuit; and
   a switch circuit including a first switch and a second switch, the first switch being coupled between the voltage generation circuit and the capacitor without an intervention of the second switch, the second switch being coupled between the capacitor and the memory cell without an intervention of the first switch, the first switch being configured to take an on-state during a first period of time and an off-state during a second period of time following the first period of time and the second switch being configured to take an off-state during the first period of time and an on-state during the second period of time;
   wherein the select transistor is configured to take an on-state during a third period of time following the first period of time and the third period of time includes all of the second period of time and longer than the second period of time.

13. The device of claim 12, wherein the select transistor is configured to take an off-state during the first period of time.

* * * * *